(12) United States Patent
Chang

(10) Patent No.: US 7,988,501 B2
(45) Date of Patent: Aug. 2, 2011

(54) IC SOCKET WITH IMPROVED CONTACT HAVING DEFORMABLE RETENTION PORTION

(75) Inventor: Chun-Yi Chang, Tu-cheng (TW)

(73) Assignee: Hon Hai Precision Ind. Co., Ltd., Taipei (TW)

( * ) Notice: Subject to any disclaimer, the term of this patent is extended or adjusted under 35 U.S.C. 154(b) by 98 days.

(21) Appl. No.: 12/386,630

(22) Filed: Apr. 21, 2009

(65) Prior Publication Data

US 2009/0263988 A1    Oct. 22, 2009

(30) Foreign Application Priority Data

Apr. 21, 2008   (TW) ................................ 97206757 U

(51) Int. Cl.
*H01R 13/42* (2006.01)
(52) U.S. Cl. ...................................... 439/751; 439/873
(58) Field of Classification Search ................... 439/751, 439/873, 66
See application file for complete search history.

(56) References Cited

U.S. PATENT DOCUMENTS

| 3,665,378 | A | * | 5/1972 | Hammell et al. | 439/748 |
| 3,923,365 | A | * | 12/1975 | Lynch | 439/751 |
| 4,641,910 | A | * | 2/1987 | Rozmus | 439/436 |
| 6,315,581 | B1 | * | 11/2001 | Yu | 439/82 |
| 6,942,495 | B2 | | 9/2005 | Liao et al. | |
| 7,435,100 | B2 | * | 10/2008 | Chang et al. | 439/66 |
| 7,625,217 | B1 | * | 12/2009 | Liao | 439/66 |

\* cited by examiner

*Primary Examiner* — Xuong M Chung Trans
(74) *Attorney, Agent, or Firm* — Wei Te Chung; Andrew C. Cheng; Ming Chieh Chang

(57) ABSTRACT

An IC socket (1) for receiving an IC package includes an insulative housing (2) with a plurality of passageways (20) thereof and a plurality of contacts (3) mounted within the passageways (20) of the insulative housing (2) respectively. The contact (3) has a base section (30), an upward contact arm (31) and a downward contact arm (32) respectively extending from the base section (30), and a pair of retaining arms (33) extending from opposite sides of the base section (30). The retaining arm (33) includes an elastic section (330) engaging with an inner wall of the passageway (20) and an opening (332) adjacent to the elastic section (330).

9 Claims, 4 Drawing Sheets

ICSOCKETWITHIMPROVEDCONTACT
HAVING DEFORMABLE RETENTION
PORTION

FIELD OF THE INVENTION

The present invention relates to an IC socket, and more particularly to IC socket having improved contacts configured with elastic retaining arms.

DESCRIPTION OF PRIOR ART

IC sockets are widely used in the computer field to interconnect two separate electronic components, i.e. an IC package and a motherboard, so as to establish electrical connection therebetween. A typical type of the IC sockets generally includes an insulative housing and a plurality of contacts received in passageway of the housing, wherein the contact usually has at least one barb interfering with the passageway of the housing so that the contact is stably retained in the housing. However, when the contact assembled in the housing is damaged and needs to be replaced by a new one, it is not easy to be take the contact out of the passageway since the barb piecing into the passageway. If the contact is pulled out forcibly, the barb of the contact is likely to scrape the insulative material of the housing off. When a new contact in mounted into the housing for replacement, the retaining force therebetween is thereby not sufficient due to the damage to the passageway.

Thus, there is a need to provide a new IC socket having redesigned contact that overcomes the above-mentioned problems.

SUMMARY OF THE INVENTION

It is therefore the object of the present invention to provide an IC socket having improved contacts that are readily to be taken away form an insulative housing without bringing damage to the insulative housing.

In accordance with the present invention, an IC socket for receiving an IC package includes an insulative housing with a plurality of passageways thereof and a plurality of contacts mounted within the passageways of the insulative housing respectively. The contact has a base section, an upward contact arm and a downward contact arm respectively extending from the base section, and a pair of retaining arms extending from opposite sides of the base section. The retaining arm includes an elastic section engaging with an inner wall of the passageway and an opening adjacent to the elastic section.

BRIEF DESCRIPTION OF THE DRAWINGS

Other objects, advantages and novel features of the present invention will become more apparent from the following detailed description when taken in conjunction with the accompanying drawings, in which.

DETAILED DESCRIPTION OF PREFERRED
EMBODIMENT

Figure 1:
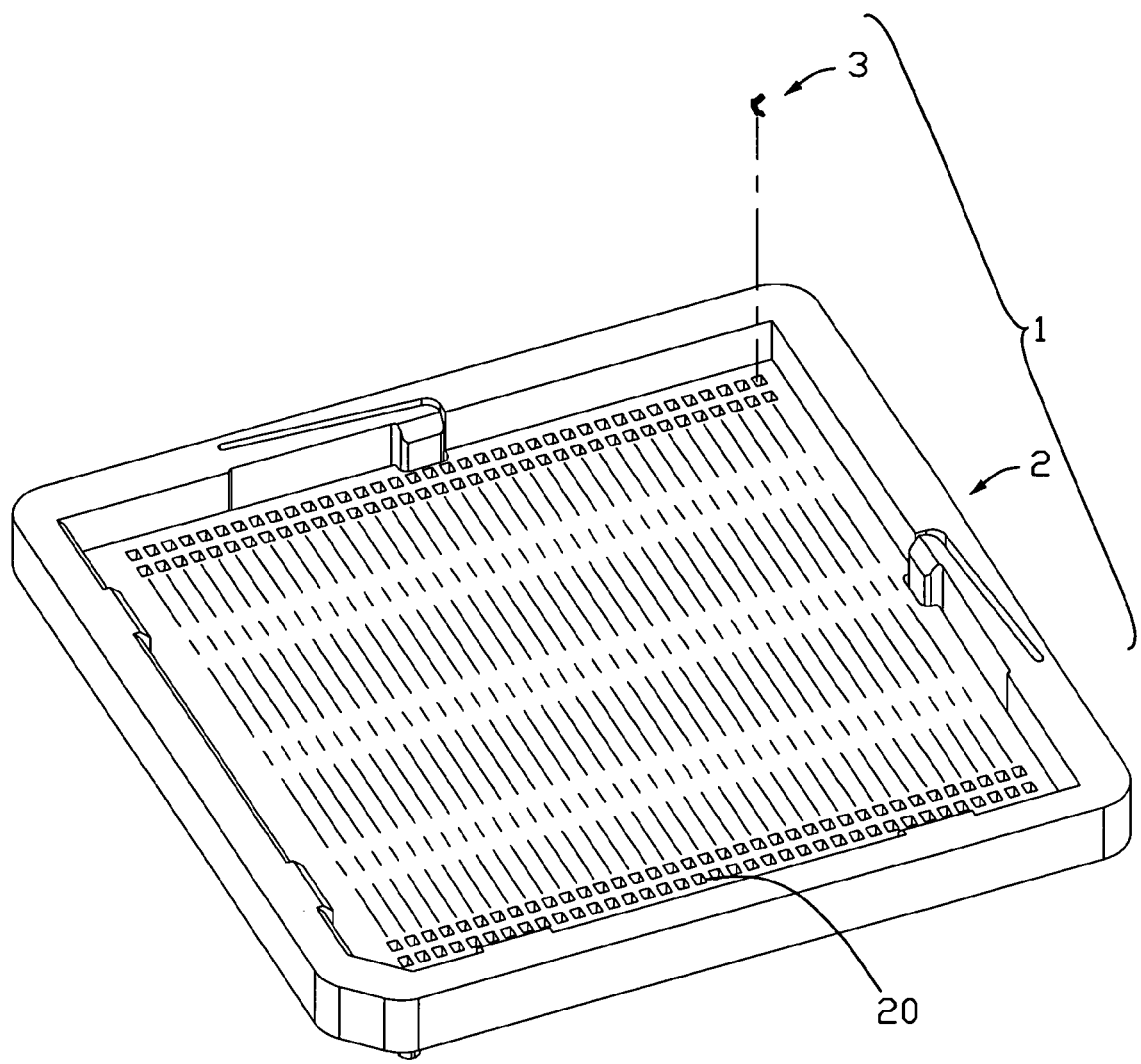
FIG. 1 is an exploded, perspective view of the IC socket in accordance with a preferred embodiment of the present invention.

Referring to FIG. 1, an IC socket 1 made in accordance with a preferred embodiment of the present invention for receiving an IC package thereon (not shown) includes a rectangular insulative housing 2 with a plurality of passageways 20 thereof, a plurality of contacts 3 received in the insulative housing 2 and mounted within the passageways 20, respectively.

Figure 2:
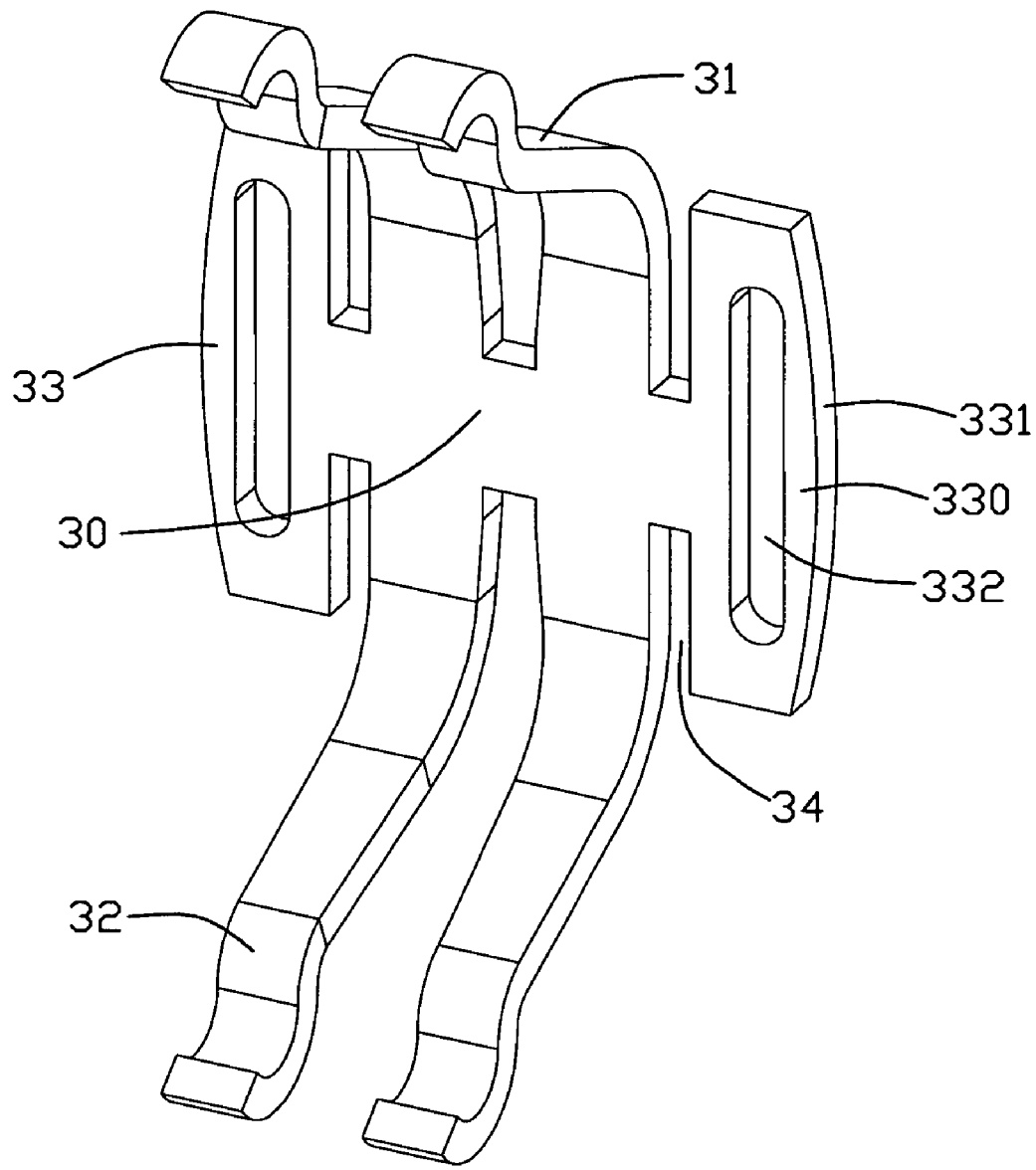
FIG. 2 is a perspective view of a contact of the preferred embodiment of the present invention.

Referring to FIG. 2, the contact 3 includes a base section 30, a pair of spaced upward contact arms 31 and a pair of spaced downward contact arms 32 respectively extending from the base section 30, and a pair of retaining arms 33 extending from opposite sides of the base section 30. The retaining arms 33 engage with inner walls (not labeled) of the passageways 20 so as to secure the contact 3 in the insulative housing 2. The retaining arm 33 along with the adjacent upward or downward contact arm 31, 33 jointly define a gap 34 therebetween. The retaining arm 33 is of a substantial longitudinal shape and has an elastic section 330 engaging with the inner wall of the passageway of the insulative housing 2 and is configured with an arch edge 331 protruding outside and directly abutting against the inner wall of the passageway 20. A full-enclosed opening 332 is formed adjacent to the elastic section 330 to provide space for the deformation of the elastic portion 330.

Figure 3:
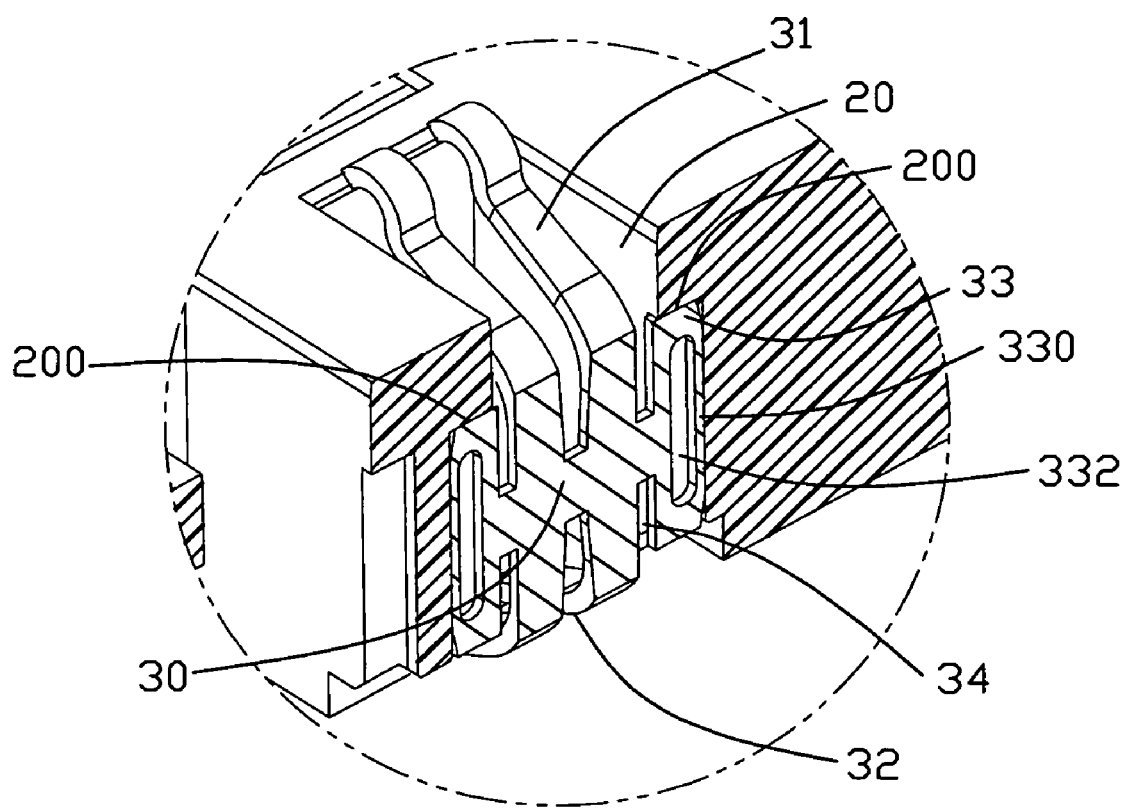
FIG. 3 is a partial cross-sectional perspective view of the IC socket, in which the contact mounted in a passageway is shown.
Figure 4:
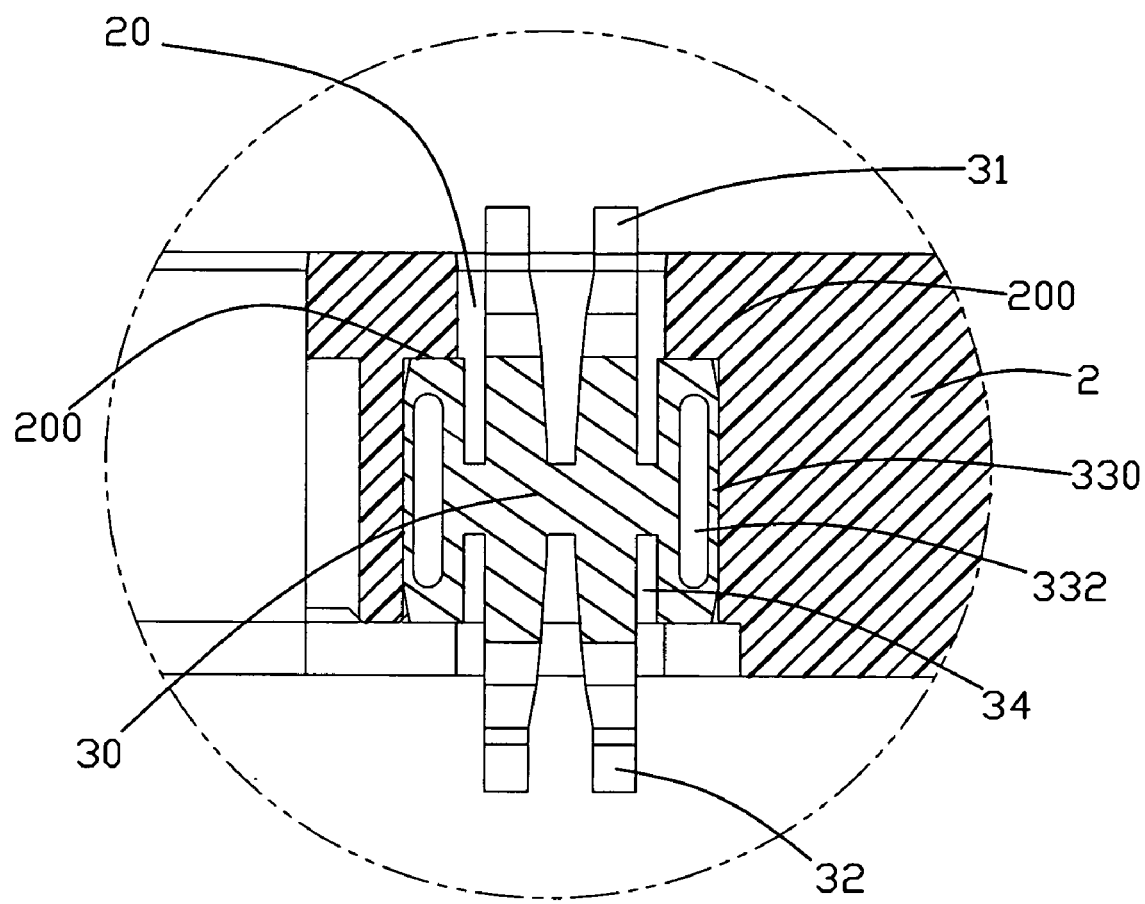
FIG. 4 is a plan view of FIG. 3.

Particularly referring to FIGS. 3-4, the passageway 20 extends through an up interface (not labeled) and a bottom interface (not labeled) of the insulative housing 2, and the contact 3 is mounted into the passageway 20 upwardly from the bottom interface with the upward contact arm 31 thereof protruding out of the up interface. The elastic section 330 deforms resiliently due to the engagement with the inner wall of the passageway 20, and thereby generates an interfering force therebetween for retaining the contact 3. In addition, passageway 20 has a pair of opposite stopping sections 200 engaging the retaining arms 33 respectively so as to prevent the contact 3 from upwardly escaping away from the passageway 20.

Since the retaining arm 33 utilizes elastic sections 330 to engage with the insulative housing 2 without destructional interference therebetween, the contact 3 could be stably retained in the passageway 20 of the insulative housing 2 while there is no risk of damaging to the passageway of the insulative housing 2. In the case that the contact 3 assembled in the passageway 20 is not qualified and needs to be replaced, the replaced contact 3 can also be retained in the passageway 20 stably with a sufficient interfering force generated therebetween. The arch edge 331 of the contact 3 further facilitates the removal of the contact 3 from the passageway 20.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An IC socket for receiving an IC package comprising:
   an insulative housing with a plurality of passageways thereof; and
   a plurality of contacts mounted within the passageways of the insulative housing respectively, the contact having a base section, an upward contact arm and a downward contact arm respectively extending from the base section, and a pair of retaining arms extending from opposite sides of the base section, the retaining arm comprising an elastic section engaging with an inner wall of the passageway and an opening adjacent to the elastic section;

wherein the retaining arm and adjacent upward or downward contact arm jointly define a gap therebetween so that the elastic section deforms toward the base section while the entire retaining arm is able to deflect in an up-to-bottom plane relative to the adjacent upward and downward contact arms, when the contact is either inserted into the passageway or pulled out of the passageway along said up-to-bottom direction.

2. The IC socket as claimed in claim 1, wherein the elastic section is configured with an arch edge abutting against the inner wall of the passageway.

3. The IC socket as claimed in claim 1, wherein the opening is full-enclosed.

4. The IC socket as claimed in claim 1, wherein the contact comprises a pair of said upward contact arms and a pair of said downward contact arms, the pair of the upward contact arms or the pair of the downward contact arms being spaced from each other.

5. The IC socket as claimed in claim 1, wherein the passageway extends through an up interface and a bottom interface of the insulative housing, the contact being mounted into the passageway upwardly from the bottom interface of the insulative housing.

6. The IC socket as claimed in claim 5, wherein the passageway has a stopping section engaging the retaining arm so as to prevent the contact from upwardly escaping away from the passageway.

7. The IC socket as claimed in claim 1, wherein the contact is symmetrically configured in the up-to-bottom direction.

8. A contact of an IC socket comprising:
a base section;
an upward contact arm and a downward contact arm respectively extending from the base section; and
a pair of retaining arms extending from opposite sides of the base section, the retaining arm comprising an elastic section with an arch edge
and an opening adjacent to the elastic section; wherein the opening is full-enclosed; wherein
the retaining arm and adjacent upward or downward contact arm jointly define transversely a gap therebetween to have said retaining arm operated independently and to promote the compliance of the retaining arm; wherein the retaining arm is deflect in an up-to-bottom plane, when the contact is inserted into the passageway or pulled out of the passageway; wherein the contact comprises a pair of said upward contact arms and a pair of said downward contact arms, the pair of the upward contact arms or the pair of the downward contact arms being spaced from each other.

9. The contact as claimed in claim 8, wherein said retaining arm is configured to be inwardly deformed during insertion into a corresponding passageway in the IC socket while still maintaining a coplanar relationship with the base section.

* * * * *